United States Patent
Lermer et al.

(10) Patent No.: US 9,269,848 B2
(45) Date of Patent: Feb. 23, 2016

(54) METHOD FOR PRODUCING A PLURALITY OF OPTOELECTRONIC SEMICONDUCTOR COMPONENTS IN COMBINATION, SEMICONDUCTOR COMPONENT PRODUCED IN SUCH A WAY, AND USE OF SAID SEMICONDUCTOR COMPONENT

(75) Inventors: Markus Lermer, Donaustauf (DE); Martin Haushalter, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/127,441

(22) PCT Filed: Jun. 21, 2012

(86) PCT No.: PCT/EP2012/062009
§ 371 (c)(1),
(2), (4) Date: Mar. 5, 2014

(87) PCT Pub. No.: WO2012/175631
PCT Pub. Date: Dec. 27, 2012

(65) Prior Publication Data
US 2014/0175462 A1    Jun. 26, 2014

(30) Foreign Application Priority Data

Jun. 22, 2011    (DE) .......................... 10 2011 105 374

(51) Int. Cl.
*H01L 25/16* (2006.01)
*H01L 31/173* (2006.01)
*H01L 31/0203* (2014.01)
(Continued)

(52) U.S. Cl.
CPC ............ *H01L 31/173* (2013.01); *H01L 25/167* (2013.01); *H01L 31/0203* (2013.01); *H01L 31/167* (2013.01); *G01S 7/4813* (2013.01); *H01L 33/486* (2013.01); *H01L 33/54* (2013.01); *H01L 2924/0002* (2013.01)

(58) Field of Classification Search
CPC .... H01L 25/167; H01L 31/167; H01L 31/173
See application file for complete search history.

(56) References Cited

U.S. PATENT DOCUMENTS 4,808,812 A    2/1989    Tanaka et al.
5,962,854 A    10/1999   Endo
(Continued)

FOREIGN PATENT DOCUMENTS

CN    101936752 A    1/2011
CN    102047444 A    5/2011
(Continued)

*Primary Examiner* — Yu Chen
(74) *Attorney, Agent, or Firm* — Slater & Matsil, L.L.P.

(57) ABSTRACT

A method for producing a plurality of optoelectronic semiconductor components in combination is specified. A plurality of radiation-emitting and radiation-detecting semiconductor chips are applied on a carrier substrate. The semiconductor chips are potted with a respective potting compound. The potting compounds are subsequently severed by sawing between adjacent semiconductor chips. A common frame is subsequently applied to the carrier substrate The common frame has a plurality of chambers open toward the top. The frame is arranged in such a way that a respective semiconductor chip is arranged in a respective chamber of the frame. A semiconductor component produced in such a way and the use of the semiconductor component are furthermore specified.

18 Claims, 2 Drawing Sheets

(51) Int. Cl.
*H01L 31/167* (2006.01)
*G01S 7/481* (2006.01)
*H01L 33/48* (2010.01)
*H01L 33/54* (2010.01)

(56) References Cited

U.S. PATENT DOCUMENTS

| | | | |
|---|---|---|---|
| 8,362,496 B1* | 1/2013 | Tu et al. | 257/82 |
| 9,165,913 B2 | 10/2015 | Zitzlrsperger et al. | |
| 2007/0018123 A1* | 1/2007 | Sano | 250/551 |
| 2008/0049210 A1* | 2/2008 | Takaoka | 356/3 |
| 2010/0258710 A1 | 10/2010 | Wiese et al. | |
| 2010/0327164 A1 | 12/2010 | Costello et al. | |
| 2011/0061340 A1* | 3/2011 | Lim et al. | 53/396 |
| 2012/0290255 A1* | 11/2012 | Kelkar et al. | 702/150 |
| 2014/0191253 A1* | 7/2014 | Haslbeck et al. | 257/82 |

FOREIGN PATENT DOCUMENTS

| | | |
|---|---|---|
| DE | 19600678 A1 | 7/1997 |
| DE | 19808004 A1 | 9/1999 |
| DE | 102008025159 A1 | 12/2009 |
| EP | 1079443 A1 | 2/2001 |
| JP | 1168171 A | 3/1999 |
| JP | 2001118865 A | 4/2001 |
| JP | 2001118885 A | 4/2001 |
| JP | 3291278 B2 | 6/2002 |

* cited by examiner

METHOD FOR PRODUCING A PLURALITY OF OPTOELECTRONIC SEMICONDUCTOR COMPONENTS IN COMBINATION, SEMICONDUCTOR COMPONENT PRODUCED IN SUCH A WAY, AND USE OF SAID SEMICONDUCTOR COMPONENT

This patent application is a national phase filing under section 371 of PCT/EP2012/062009, filed Jun. 21, 2012, which claims the priority of German patent application 10 2011 105 374.7, filed Jun. 22, 2011, each of which is incorporated herein by reference in its entirety.

TECHNICAL FIELD

The invention relates to a method for producing a plurality of optoelectronic semiconductor components in combination, each having a radiation-emitting semiconductor chip, a radiation-detecting semiconductor chip and a frame, and to a semiconductor component produced in such a way, and to the use of said semiconductor component.

BACKGROUND

Conventionally, semiconductor components having a radiation-emitting semiconductor chip and a radiation-detecting semiconductor chip are usually not produced in combination. By way of example, although conventionally a plurality of semiconductor chips are applied on a common carrier substrate, the carrier substrate is singulated to form individual semiconductor components before a frame is applied. Respective individual frames are subsequently applied to the singulated components.

On account of this further processing in the singulated state, however, the production costs and also the production time disadvantageously increase.

SUMMARY OF THE INVENTION

Aspects of the present invention specify a method for producing a plurality of optoelectronic semiconductor components in combination which is cost-effective and time-efficient. Other aspects of the present invention specify a production method which enables a flexible frame with regard to the design. Further aspects of the present application specify an optoelectronic component which is produced in combination by a method of this type.

In accordance with one embodiment, the method for producing a plurality of optoelectronic semiconductor components in combination, each having a radiation-emitting semiconductor chip, a radiation-detecting semiconductor chip and a frame, comprises the following method steps:

A) providing a carrier substrate,
B) applying a plurality of radiation-emitting semiconductor chips and radiation-detecting semiconductor chips to the carrier substrate and making electrical contact with them, wherein a radiation-detecting semiconductor chip is assigned to a respective radiation-emitting semiconductor chip,
C) potting the plurality of radiation-emitting semiconductor chips with a first potting compound,
D) potting the plurality of radiation-detecting semiconductor chips with a second potting compound,
E) severing the first and second potting compounds by means of sawing between adjacent semiconductor chips,
F) applying a common frame to the carrier substrate, said common frame having a plurality of chambers open toward the top, wherein the frame is arranged in such a way that a respective semiconductor chip is arranged in a respective chamber of the frame.

Furthermore, the method can comprise the method step G), which involves carrying out singulation to form a plurality of optoelectronic semiconductor components.

In the present production method, accordingly, a carrier substrate is populated with a plurality of semiconductor chips arranged in combination, wherein a common frame is subsequently arranged onto the semiconductor chips in combination. Accordingly, rather than individual frames being formed for the semiconductor components, the frame is likewise formed in one-piece and mounted in combination onto the carrier substrate above the semiconductor chips. This advantageously increases the throughput when attaching the frame to the carrier substrate, as a result of which the production time is advantageously reduced. Moreover, the productivity is increased, as a result of which lower production costs are incurred. Since the frame is formed in one-piece and is producible in a separate method step, additionally the flexibility and the design freedom of the frame are advantageously increased. A frame formed in such a way can thus be adapted to desired requirements.

Preferably, in method step B) the radiation-emitting semiconductor chips are arranged in one or in a plurality of straight lines on the carrier substrate, wherein the radiation-detecting semiconductor chips are likewise arranged in one or a plurality of straight lines on the carrier substrate, which run parallel to the straight lines of the radiation-emitting semiconductor chips. In this case, the lines comprising radiation-emitting and radiation-detecting semiconductor chips advantageously alternate. In a plan view of the carrier substrate, the semiconductor chips are accordingly arranged in a matrix-like fashion, wherein the columns of the matrix arrangement in this case respectively comprise radiation-emitting or radiation-detecting semiconductor chips. In the rows of the matrix arrangement, radiation-emitting and radiation-detecting semiconductor chips switch alternately.

On account of this linear arrangement, in method step C) the plurality of radiation-emitting semiconductor chips can be jointly potted with a first potting compound. In particular, the radiation-emitting semiconductor chips in a line are jointly potted. Likewise, the radiation-detecting semiconductor chips in a line can be jointly potted.

In method step E) the potting compounds are separated by sawing. In this case, the severing is effected in the matrix arrangement parallel to a row. In particular, the severing is effected perpendicularly to the linear arrangement of the potting compounds.

The arrangement of a respective semiconductor chip in a respective chamber of the frame causes each semiconductor chip to be laterally completely enclosed or surrounded by the frame. Each chamber is open only towards the top, such that radiation can enter into the chamber or exit from the chamber there. The frame advantageously prevents optical crosstalk between radiation-emitting semiconductor chip and radiation-detecting semiconductor chip.

In this case, the frame is advantageously formed in such a way that it substantially completely covers the carrier substrate apart from the regions of the chambers. The dimensions of the frame are thus adapted to the dimensions of the carrier substrate.

The radiation-emitting semiconductor chips each have a radiation exit side for the radiation generated in the semiconductor chip. Preferably in each case a large proportion of the radiation generated in the chip is coupled out from the radiation exit side, with preference 80%, preferably 90%, particularly preferably 95%, of the radiation generated in the chip. The radiation-detecting semiconductor chip has a corresponding radiation entrance side for the radiation to be detected in the semiconductor chip.

The active layers of the semiconductor chips preferably each contain a pn junction, a double heterostructure, a single quantum well (SQW) structure or a multi quantum well (MQW) structure for generating radiation. The semiconductor chips each have, for example, a semiconductor layer sequence containing the active layer in each case. The semiconductor layer sequence is in each case preferably based on a III/V semiconductor material. The semiconductor layer sequence is preferably grown onto a growth substrate, which can be completely or partly detached.

The semiconductor chips are in each case formed as optoelectronic components which enable electronically generated data or energies to be converted into light emission, or vice versa. The radiation-emitting semiconductor chip is an LED, for example. The radiation-detecting semiconductor chip is a radiation detector or a light sensor, for example.

In accordance with at least one embodiment, method step E) involves sawing at least partly into the carrier substrate. In this case, advantageously, the carrier substrate is not sawn through, but rather only incipiently sawn. As a result, advantageously in the subsequent method step F) the frame can be mechanically fixed in the sawing cuts of the carrier substrate.

In accordance with at least one embodiment, after method step F) or before method step F), the combination is singulated into individual semiconductor components, in particular by means of sawing. Accordingly, the frame can be mounted on the carrier substrate after the first sawing step and before the second sawing step. The semiconductor components can subsequently be processed further in combination. By way of example, it is possible to carry out a visual final inspection of the semiconductor components in combination.

Alternatively, it is possible to apply the frame to the singulated components after the second sawing step. In this case, the frame is formed in one-piece and is subsequently singulated.

The production method accordingly comprises at least two sawing steps, wherein the first sawing step does not singulate the carrier substrate, but rather at most incipiently saws it. Only the second sawing step singulates the combination to form individual semiconductor components.

In accordance with at least one embodiment, in method steps C) and D) the potting compounds, that is to say for example the first potting compound and the second potting compound, are applied in each case by a transfer molding method. In this case, method steps C) and D) can be effected in a single process step.

In accordance with at least one embodiment, in method step F), the common frame is fixed on the carrier substrate by means of an adhesive layer. Accordingly, the frame is not applied to the carrier substrate by means of a transfer molding method, but rather is produced separately and subsequently mounted on the carrier substrate by means of an adhesive layer. This enables a higher flexibility and a higher design freedom of the frame.

In accordance with at least one embodiment, the common frame is produced in a separate injection molding method. Accordingly, the frame can be an injection-molded frame which is produced in parallel with the carrier substrate and is mounted after the mounting of the semiconductor chips on the carrier substrate.

In accordance with at least one embodiment, in method step F), the frame is applied on the carrier substrate at least partly in the regions of the potting compounds that were severed in method step E). Method step E) therefore involves severing the first and second potting compounds between adjacent semiconductor chips. In this case, the potting compounds are separated in such a way that chamber walls can be introduced in the separating line or sawing line. In this regard, in method step F) each semiconductor chip can be arranged in a dedicated chamber of the frame.

In accordance with at least one embodiment, an optoelectronic semiconductor component produced in this way comprises a carrier substrate, a radiation-emitting semiconductor chip, a radiation-detecting semiconductor chip and a frame. The frame is fixed on the carrier substrate in order if possible to avoid reflections at the frame.

In this case, it is possible for a first chamber and a second chamber to be formed in the frame, said chambers each being open toward the top. The radiation-emitting semiconductor chip then has an active layer suitable for generating radiation, is potted by means of a first potting compound and is arranged in the first chamber on the carrier substrate. In this case, the radiation-detecting semiconductor chip has an active layer suitable for detecting radiation, is potted by means of a second potting compound and is arranged in the second chamber on the carrier substrate. An optical barrier is formed through the chambers by means of the frame between the radiation-emitting semiconductor chip and the radiation-detecting semiconductor chip.

Open toward the top means, in particular, that the frame on the side facing away from the carrier substrate in each case has an opening in the region of the chamber.

The features mentioned in conjunction with the production method are also used in association with the semiconductor component, and vice versa.

Accordingly, the semiconductor component comprises at least two semiconductor chips which are spatially separate by means of a frame, preferably an injection-molded frame, such that the frame prevents optical crosstalk between the individual semiconductor chips. In this case, the frame is preferably applied on the carrier substrate by means of an adhesive layer.

In accordance with at least one embodiment, the frame is formed from a black potting compound. By way of example, the potting compound of the frame contains carbon black, such that the frame is non-light-transmissive.

In accordance with at least one embodiment, the frame is formed from a non-light-transmissive material and the first potting compound and the second potting compound are formed from a light-transmissive material. This ensures that optical crosstalk can be prevented between the semiconductor chips on account of the non-light-transmissive frame, wherein at the same time coupling-in of light into the semiconductor chips or coupling-out of light from the semiconductor chips is made possible through the openings of the frame and through the light-transmissive potting compounds.

In accordance with at least one embodiment, the first potting compound and the second potting compound are embodied at least regionally in the form of a lens. By way of example, the semiconductor chips are each completely enclosed by the respective potting compound, wherein the potting compounds have a lens form in the region of the light entrance and respectively light exit opening of the semiconductor chips. In this regard, radiation-shaping of the radiation emitted by the semiconductor chip and respectively radiation to be detected by the semiconductor chip can be obtained.

In accordance with at least one embodiment, a further radiation-detecting semiconductor chip is arranged in the second chamber. In this case, the semiconductor component accordingly comprises one radiation-emitting semiconductor chip and two radiation-detecting semiconductor chips, wherein the radiation-emitting semiconductor chip is optically isolated from the two radiation-detecting semiconductor chips by means of the frame. By contrast, the radiation-detecting semiconductor chips are not optically isolated from one another. In this case, the radiation-detecting semiconductor chips fulfill different functions, for example, and are sensitive to radiation in different wavelength ranges.

In accordance with at least one embodiment, the radiation-emitting semiconductor chip is an IR transmitter, for example, an LED which emits infrared radiation. The radiation-detecting semiconductor chip is preferably an IR receiver, for example a radiation detector which is sensitive to infrared radiation, and the further radiation-detecting semiconductor chip is preferably an ambient light sensor. The further radiation-detecting semiconductor chip is thus sensitive, for example, to radiation in the visible wavelength range. The radiation-detecting semiconductor chips accordingly fulfill different functions. In particular, the IR receiver is provided for detecting the radiation emitted by the IR transmitter. The further radiation-detecting semiconductor chip is provided for detecting the ambient light of the component.

In accordance with at least one embodiment, the first chamber and the second chamber each have a diaphragm opening in a preferred direction. In particular, the openings are formed in the frame in the region of each chamber in such a way that the radiation emitted by the semiconductor chip and respectively the radiation to be detected for the semiconductor chip are directed in a preferred direction. For this purpose, the diaphragm opening has at one side, for example, an oblique side surface at which the radiation emitted by the semiconductor chip or radiation to be detected by the semiconductor chip is reflected in a preferred direction. In this case, the opposite side surface of the diaphragm opening can be formed in a perpendicular fashion, for example, such that a reflection in the direction of a different angle is produced at this side surface. Preferably, the side surfaces of the diaphragm openings which are adjacent to the adjacent semiconductor chip have the perpendicular configuration. The remaining side surfaces of the chamber openings preferably have in each case an oblique side surface, that is to say a side surface which is arranged at an angle of between 0 and 90° with respect to the lateral extent of the carrier substrate. As a result, optical crosstalk between the semiconductor chips can be further prevented.

In accordance with at least one embodiment, the semiconductor component comprising radiation-emitting semiconductor chip and radiation-detecting semiconductor chip is used as a distance sensor and/or ambient light sensor. Particularly in the case of the configuration of the component comprising three semiconductor chips, that is to say one radiation-emitting semiconductor chip and two radiation-detecting semiconductor chips, both a distance sensor and an ambient light sensor can be realized in one component.

BRIEF DESCRIPTION OF THE DRAWINGS

Further advantages and advantageous developments of the invention will become apparent from the exemplary embodiments described below in conjunction with FIGS. 1 to 3, in which.

In the figures, identical or identically acting constituent parts may be provided in each case with the same reference signs. The illustrated constituent parts and their size relationships among one another should not be regarded as true to scale. Rather, individual constituent parts such as, for example, layers, structures, components and regions may be illustrated with exaggerated thickness or size dimensions in order to enable better illustration and/or in order to afford a better understanding.

DETAILED DESCRIPTION OF ILLUSTRATIVE EMBODIMENTS

Figure 1:
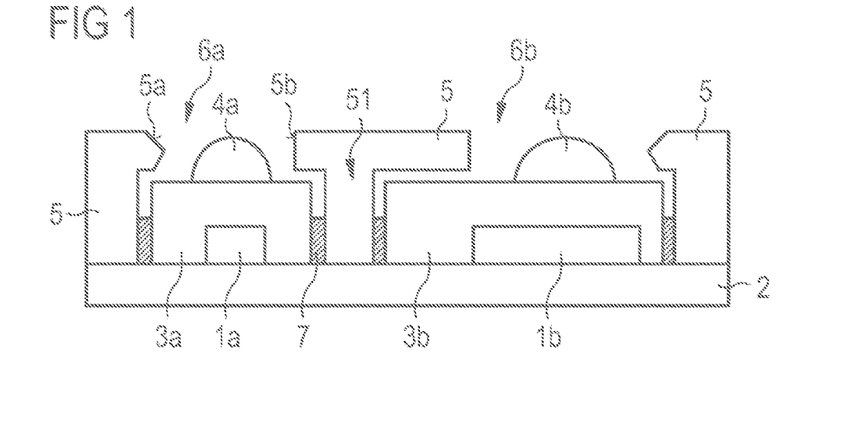
FIG. 1 shows a schematic cross section of an exemplary embodiment of a semiconductor component according to the invention.

FIG. 1 shows a cross section of a semiconductor component comprising a carrier substrate 2, on which a radiation-emitting semiconductor chip 1a and a radiation-detecting semiconductor chip 1b are arranged and electrically connected to, for example, conductor tracks on the carrier substrate. In this case, the semiconductor chips 1a, 1b are arranged in a manner laterally spaced apart from one another on the carrier substrate 2.

The radiation-emitting semiconductor chip 1a has an active layer suitable for generating radiation. By way of example, the radiation-emitting semiconductor chip 1a is an LED which emits radiation in the infrared wavelength frame. The radiation-detecting semiconductor chip 1b has an active layer suitable for detecting radiation and is, for example, a light sensor suitable for detecting radiation in the infrared wavelength range.

The carrier substrate 2 is, for example, a circuit board, preferably a PCB (printed circuit board).

The radiation-emitting semiconductor chip 1a is potted with a first potting compound 3a. Correspondingly, the radiation-detecting semiconductor chip 1b is potted with a second potting compound 3b. A distance is arranged between the potting compounds 3a, 3b in a lateral direction. The potting compounds 3a and 3b in each case preferably completely envelop the semiconductor chips 1a and 1b. The first potting compound 3a and the second potting compound 3b are formed from a light-transmissive material, such that the radiation emitted by the semiconductor chip 1a and the radiation to be detected by the semiconductor chip 1b can pass through the potting compounds 3a, 3b to the light coupling-in and respectively light coupling-out surface of the semiconductor chips. The potting compounds 3a, 3b are, for example, light-transmissive to radiation in the infrared and/or visible wavelength range.

The first potting compound 3a and the second potting compound 3b are embodied regionally in the form of a lens 4a, 4b. In particular, the lens 4a is disposed downstream of the light exit surface of the first semiconductor chip 1a. The second lens 4b is likewise arranged ahead of the light entrance surface of the second semiconductor chip 1b. By way of example, the potting compound 3a is embodied regionally in the form of a parallelepiped or cube, in which the semiconductor chip 1a is arranged, wherein the first lens 4a is formed on the cube in the emission direction. The second potting compound 3b can be formed in a corresponding manner. The potting compounds 3a, 3b, in particular the lenses 4a, 4b, are produced in this case, for example, in a transfer molding method.

A frame 5 is furthermore fixed on the carrier substrate 2, said frame having a first chamber 6a and a second chamber 6b, which are each open toward the top. Open toward the top means, in particular, that the frame 5 on the side facing away from the carrier substrate 2 has two openings in the regions of the chambers 6a, 6b. The first semiconductor chip 1a and the first potting compound 3a are arranged in the first chamber 6a of the frame 5. Correspondingly, the second semiconductor chip 1b and the second potting compound 3b are arranged in the second chamber 6b of the frame. Between the radiation-emitting semiconductor chip 1a and the radiation-detecting semiconductor chip 1b, an optical barrier 51 is formed through the chambers by means of the frame. In particular, chamber walls are arranged between the radiation-emitting semiconductor chip 1a and the radiation-detecting semiconductor component 1b, which form the optical barrier 51 and thus prevent optical crosstalk between the radiation-emitting semiconductor chip 1a and the radiation-detecting semiconductor chip 1b.

The frame 5 is preferably an injection-molded frame which is produced in a separate production step and subsequently mounted on the carrier substrate. In particular, the frame 5 is mounted after the application and potting of the semiconductor chips on the frame. By way of example, the frame is fixed on the carrier substrate 2 by means of an adhesive layer 7.

On account of the subsequent fixing of the frame 5, a respective distance is arranged between the potting compounds 3a, 3b and the frame 5, which distance can be filled, for example, at least partly with the adhesive layer 7. Accordingly, the potting compounds 3a, 3b do not directly adjoin the frame 5.

The frame 5 is preferably formed from a non-light-transmissive material; by way of example, the frame 5 is formed from a black potting compound. It is thus preferably possible to prevent the optical crosstalk between radiation-emitting semiconductor chip and radiation-detecting semiconductor chip.

The lenses 4a, 4b are arranged at least regionally in the openings of the frame 5. Preferably, the lenses 4a, 4b do not project beyond the frame 5 in a vertical direction. Preferably, the height of the lenses 4a, 4b corresponds approximately to the height of the frame 5.

The frame 5 has, in the region of the chambers 6a, 6b, in particular in the openings of the frame 5, a respective diaphragm opening in a preferred direction. This diaphragm opening in a preferred direction can be realized, in particular, by side surfaces of the openings of the frame being formed differently obliquely, that is to say having a different angle relative to the lateral extent of the carrier substrate 2. By way of example, a first side surface 5a of the openings of the frame 5 is formed obliquely, that is to say at an angle of between 0 and 90° relative to the lateral orientation of the carrier substrate 2. A second side surface 5b, which is arranged, for example, opposite the first side surface 5a, has a perpendicular orientation with respect to the lateral extent of the carrier substrate 2. The radiation emitted by the radiation-emitting semiconductor chip 1a is thus reflected at a different angle at the second side surface 5b than at the first oblique side surface 5a, such that the radiation emerging from the opening of the frame 5 is directed in a preferred direction. The opening of the second chamber 6b of the second semiconductor chip 1b is formed in the corresponding manner. Preferably, all side surfaces of the openings of the first chamber 6a and of the second chamber 6b are formed obliquely, that is to say at an angle of between 0 and 90°, apart from the side surface 5b formed at the optical barrier 51, that is to say the side surface of the openings which is arranged between radiation-emitting semiconductor chip 1a and radiation-detecting semiconductor chip 1b. In this case, therefore, three side surfaces of the openings are formed obliquely. Only one side surface has a perpendicular formation.

A semiconductor component as illustrated in the exemplary embodiment in FIG. 1 can be used, for example, as a distance and/or ambient light sensor.

The exemplary embodiment in FIG. 1 is produced in a combination with a plurality of semiconductor components. A production method of this type will be explained in greater detail in conjunction with the exemplary embodiments in FIGS. 2A to 2D.

Figure 3:
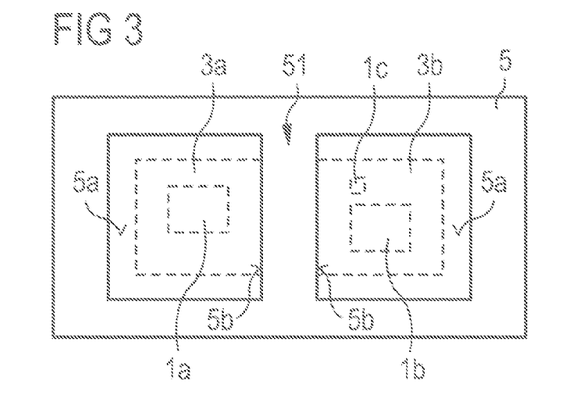
FIG. 3 shows a schematic plan view of an exemplary embodiment of a semiconductor component according to the invention in accordance with the exemplary embodiment from FIG. 1.

FIG. 3 illustrates a plan view of the semiconductor component in accordance with the exemplary embodiment in FIG. 1. The plan view illustrates the frame 5 having two rectangular or cuboid-shaped openings, in which the semiconductor chips 1a, 1b are respectively arranged. The frame is formed such that the optical barrier 51 is formed between the openings and between the semiconductor chips. The openings have side surfaces 5a, 5b wherein the side surfaces 5b at the optical barrier 51 are formed perpendicularly. The remaining side surfaces 5a have an oblique formation, such that a diaphragm function in a preferred direction is realized by the openings. The semiconductor chips 1a, 1b are respectively potted with the potting compounds 3a, 3b.

In the second chamber, in which the radiation-detecting semiconductor chip 1b is arranged, a further radiation-detecting semiconductor chip 1c is arranged, which is an ambient light sensor, for example. The radiation-detecting semiconductor chips 1b, 1c are in this case not optically isolated from one another since they fulfill different functions and therefore do not mutually influence or obstruct one another in terms of their function. The optical barrier 51 is formed only between the radiation-detecting semiconductor chips 1b, 1c and the radiation-emitting semiconductor chip 1a.

For the rest, the exemplary embodiment in FIG. 3 substantially corresponds to the exemplary embodiment in FIG. 1.

Figure 2A:
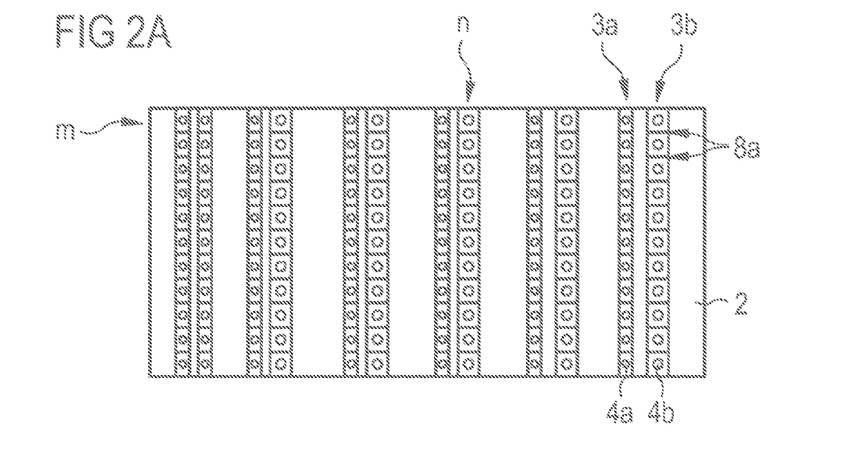
FIGS. 2A to 2D each show excerpts from semiconductor components according to the invention in combination in the production method.

FIG. 2A illustrates a first production step of a method for producing a semiconductor component in accordance with FIGS. 1A and 3. The semiconductor component is produced in particular in a combination comprising a plurality of semiconductor components. In this case, each semiconductor component comprises a radiation-emitting semiconductor chip and at least one radiation-detecting semiconductor chip.

FIG. 2A illustrates a schematic plan view of a carrier substrate 2, on which the plurality of semiconductor chips are arranged. In particular, some of the radiation-emitting semiconductor chips potted with the first potting compound 3a are arranged in a first column n on the carrier substrate 2. These semiconductor chips thus form a linear arrangement with respect to one another. A second column n is formed in a parallel fashion at a lateral distance, in which second column are arranged the radiation-detecting semiconductor chips potted with the second potting compound 3b. The first and second columns of the radiation-emitting semiconductor chips and radiation-detecting semiconductor chips switch alternately on the carrier substrate 2.

The potting compounds have a respective lens-shaped formation 4a, 4b, wherein a lens is disposed ahead of each semiconductor chip. A respective radiation-detecting semiconductor chip is arranged laterally alongside a radiation-emitting semiconductor chip. In this case, the radiation-emitting semiconductor chips in a column have a common first potting compound 3a and the radiation-detecting semiconductor chips in the adjacent column in this case each have a common second potting compound 3b.

In this case, the columns comprising radiation-emitting semiconductor chips and radiation-detecting semiconductor chips alternate repeatedly on the carrier substrate, thus giving rise to a matrix arrangement of the semiconductor chips on the carrier substrate. In each case only radiation-emitting or respectively radiation-detecting semiconductor chips are situated in the columns n. In the rows m, a radiation-emitting semiconductor chip is respectively arranged adjacent to a radiation-detecting semiconductor chip.

The first potting compound 3a and the second potting compound 3b are in each case formed in one-piece in a linear fashion over the respective columns of the semiconductor chips. In a subsequent method step, the first potting compound 3a and the second potting compound 3b are severed by means of sawing between adjacent semiconductor chips in each case in a column n. The potting compounds are accordingly severed in accordance with the sawing lines 8a. This can involve sawing at least partly additionally into the carrier substrate 2. In this case, however, the carrier substrate 2 is not completely severed, and so the components are still present in combination. The potting compounds are opened in accordance with the sawing lines 8a only between the individual semiconductor chips in a column n, such that the carrier substrate is exposed in regions of the sawing lines 8a.

Figure 2B:
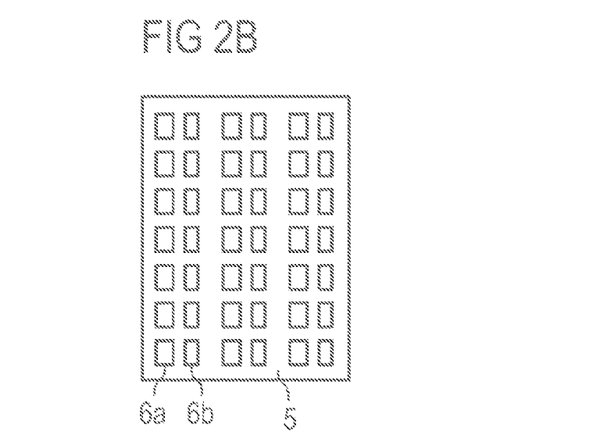

In parallel, subsequently or beforehand, a frame 5 is produced in a separate injection molding method, as shown in FIG. 2B. FIG. 2B shows a plan view of the frame 5. In this case, the frame 5 has a plurality of chambers 6a, 6b, wherein a respective chamber 6a, 6b is assigned to a semiconductor chip on the carrier substrate. A common frame 5 is thus produced for the plurality of semiconductor chips on the carrier substrate in combination as illustrated in FIG. 2. Preferably, the frame 5 produced has corresponding dimensions which approximately correspond to the dimensions of the carrier substrate 2.

In the subsequent method step, the common frame 5 of the exemplary embodiment in FIG. 2B is applied to the carrier substrate 2 of the exemplary embodiment in FIG. 2A, wherein the frame is arranged in such a way that a respective semiconductor chip is arranged in a respective chamber of the frame. For this purpose, the frame is applied, for example, at least partly in the severed regions of the potting compounds on the carrier substrate and fixed on the carrier substrate, for example, by means of an adhesive layer.

After the fixing of the common frame on the carrier substrate with a plurality of semiconductor chips, the combination can be singulated into individual semiconductor components by means of sawing. In particular, the combination can be singulated before the frame is applied on the carrier substrate, wherein in this case the common frame is subsequently applied on the singulated components, said common frame subsequently being singulated to form individual components.

Alternatively, it is possible firstly to apply the frame on the carrier substrate, wherein this combination comprising carrier substrate and frame is subsequently singulated to form individual semiconductor components by means of sawing.

Figure 2C:
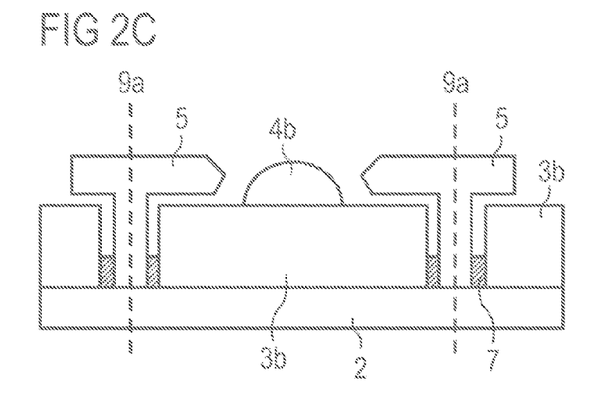
Figure 2D:
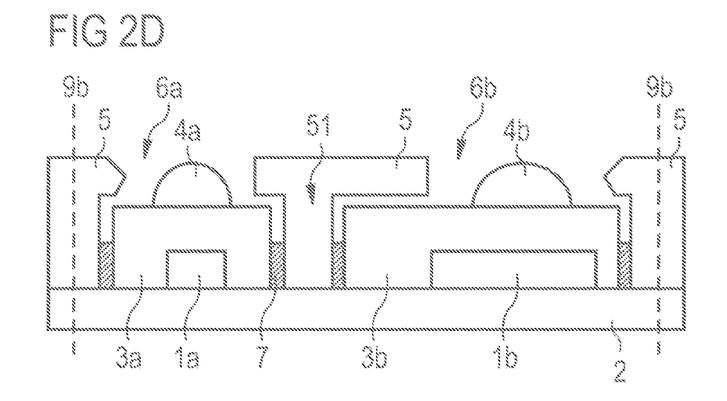

FIGS. 2C and 2D show necessary sawing steps for releasing the semiconductor components from the combination. In a first sawing step, as illustrated in FIG. 2C, the combination is sawn along the rows in accordance with the sawing lines 9a. FIG. 2C shows a cross section of the combination, only an excerpt being illustrated for the sake of clarity. In this case, the first sawing cut 9a is led through the frame 5, such that the combination is singulated to form the rows. In this case, each row has semiconductor components arranged laterally alongside one another. In order to further singulate these rows, these rows are subsequently singulated in accordance with the columns in a second sawing step, as illustrated in FIG. 2B.

FIG. 2B, for the sake of clarity, once again only shows an excerpt from a component in the combination of a row. By singulating the rows in accordance with the sawing lines 9b through the frame 5, it is thus possible to produce singulated semiconductor components.

Producing the components in combination advantageously increases the productivity, as a result of which the production costs and the production type are reduced. Moreover, it is possible to obtain a higher throughput when attaching the frame on the carrier substrate. A higher flexibility and design freedom of the frame can be ensured on account of the separate production of the frame in the injection molding method. Furthermore, it is possible to obtain thin wall thicknesses of the frame and, as a result, particularly small design dimensions.

The invention is not restricted to the exemplary embodiments by the description on the basis of said exemplary embodiments, but rather encompasses any novel feature and also any combination of features, which in particular includes any combination of features in the patent claims, even if these features or these combinations themselves are not explicitly specified in the claims of exemplary embodiments.

The invention claimed is:

1. A method for producing a plurality of optoelectronic semiconductor components in combination, each semiconductor component having a radiation-emitting semiconductor chip, a radiation-detecting semiconductor chip and a frame, the method comprising:

providing a carrier substrate;

applying a plurality of radiation-emitting semiconductor chips and radiation-detecting semiconductor chips to the carrier substrate and making electrical contact with them, wherein each radiation-detecting semiconductor chip is assigned to a respective radiation-emitting semiconductor chip, wherein each of the radiation-emitting semiconductor chips has an active layer configured to generate radiation, and wherein each of the radiation-detecting semiconductor chips has an active layer configured to detect radiation;

potting the plurality of radiation-emitting semiconductor chips with a first potting compound;

potting the plurality of radiation-detecting semiconductor chips with a second potting compound;

severing the first and second potting compounds by sawing between adjacent semiconductor chips; and applying a common frame to the carrier substrate, the common frame having a plurality of chambers open toward the top, wherein the common frame is arranged in such a way that a respective semiconductor chip is arranged in a respective chamber of the common frame, wherein the frame forms an optical barrier between each chip of the plurality of radiation-detecting semiconductor chips and the respective assigned radiation-emitting semiconductor chip, and wherein, after the applying the common frame, the common frame is separated from the first and second potting compounds by a first region and an adhesive layer is disposed in, and fills, the first region between the frame and the first and second potting compounds for fixing of the frame to the substrate during the applying the common frame, and such that the first and second potting compounds do not directly adjoin the common frame;

wherein the plurality of chambers includes a first chamber and a second chamber each having a diaphragm opening in a preferred direction; and wherein side surfaces of the diaphragm openings are formed at different angles and obliquely to a major surface of the substrate.

2. The method according to claim 1, wherein the severing comprises sawing at least partly into the carrier substrate.

3. The method according to claim 1, further comprising singulating the combination into individual semiconductor components by sawing before or after applying the common frame.

4. The method according to claim 1, wherein the first potting compound and the second potting compound are each applied by a transfer molding method.

5. The method according to claim 1, wherein applying the common frame comprises applying the frame on the carrier substrate at least partly in regions where the potting compounds were severed.

6. The method according to claim 1, further comprising producing the common frame in a separate injection molding method.

7. The method according to claim 1, wherein:
the common frame is produced separately and subsequently mounted on the carrier substrate by the adhesive layer.

8. The method according to claim 7, wherein:
a first side surface of one diaphragm opening is formed at an angle of between 0° and 90° relative to a lateral extent of the carrier substrate; and
a second side surface of the diaphragm opening that is arranged opposite the first side surface has a perpendicular orientation with respect to the lateral extent of the carrier substrate.

9. An optoelectronic semiconductor component comprising:
a carrier substrate;
a frame fixed on the carrier substrate with an adhesive layer, wherein a first chamber and a second chamber are formed in the frame, the first and second chambers each being open toward the top, wherein the first chamber and the second chamber each have a diaphragm opening in a preferred direction, side surfaces of the diaphragm openings being formed at different angles and obliquely to a major surface of the carrier substrate;
a radiation-emitting semiconductor chip that has an active layer suitable for generating radiation and is arranged in the first chamber on the carrier substrate, the radiation-emitting semiconductor chip being potted with a first potting compound;
a radiation-detecting semiconductor chip that has an active layer suitable for detecting radiation and is arranged in the second chamber on the carrier substrate, the radiation-detecting semiconductor chip being potted with a second potting compound; and
an optical barrier formed through the chambers by the frame between the radiation-emitting semiconductor chip and the radiation-detecting semiconductor chip;
wherein the adhesive layer is disposed in, and fills, a first region between the frame and the first and second potting compounds, the frame spaced apart from the first and second potting compounds by a first distance of the first region such that the first and second potting compounds do not directly adjoin the frame.

10. The semiconductor component according to claim 9, wherein the frame is formed in one-piece and from a black potting compound.

11. The semiconductor component according to claim 9, wherein the frame is formed from a non-light-transmissive material and the first potting compound and the second potting compound are formed from a light-transmissive material.

12. The semiconductor component according to claim 9, wherein the first potting compound and the second potting compound are embodied at least regionally in the form of a lens.

13. The semiconductor component according to claim 9, further comprising a further radiation-detecting semiconductor chip arranged in the second chamber.

14. The semiconductor component according to claim 13, wherein the radiation-emitting semiconductor chip comprises an IR transmitter, the radiation-detecting semiconductor chip comprises an IR receiver and the further radiation-detecting semiconductor chip comprises an ambient light sensor.

15. The semiconductor component according to claim 9, wherein the semiconductor component is used as at least one of a distance and a ambient light sensor.

16. The semiconductor component according to claim 9, wherein a first side surface of one diaphragm opening is formed at an angle of between 0° and 90° relative to a lateral extent of the carrier substrate and a second side surface of the one diaphragm opening being arranged opposite the first side surface has a perpendicular orientation with respect to the lateral extent of the carrier substrate.

17. The semiconductor component according to claim 9, wherein the diaphragm openings are disposed in top surfaces of the respective first and second chambers;
wherein the first potting compound having a first topmost surface disposed below a bottommost portion of the side surfaces of the diaphragm openings; and
wherein the second potting compound having a second topmost surface disposed below the bottommost portion of the side surfaces of the diaphragm openings.

18. A method for producing a plurality of optoelectronic semiconductor components in combination, each having a radiation-emitting semiconductor chip, a radiation-detecting semiconductor chip and a frame, the method comprising:
providing a carrier substrate;
applying a plurality of radiation-emitting semiconductor chips and radiation-detecting semiconductor chips to the carrier substrate and making electrical contact with them, wherein each of the plurality of radiation-detecting semiconductor chips is assigned to a respective radiation-emitting semiconductor chip, wherein each of the radiation-emitting semiconductor chips has an active layer configured to generate radiation, and wherein each of the radiation-detecting semiconductor chips has an active layer configured to detect radiation;
potting the plurality of radiation-emitting semiconductor chips with a first potting compound;
potting the plurality of radiation-detecting semiconductor chips with a second potting compound;
severing the first and second potting compounds by sawing between adjacent semiconductor chips; and
applying a common frame to the carrier substrate, the common frame having a plurality of chambers open toward the top and each having a diaphragm opening in a preferred direction, wherein the frame is arranged in such a way that a respective semiconductor chip is arranged in a respective chamber of the frame and such that the frame is spaced apart from the first and second potting compounds by a first region, wherein the frame forms an optical barrier between each chip of the plurality of radiation-detecting semiconductor chips and the respective assigned radiation-emitting semiconductor chip, wherein the common frame is produced separately and subsequently mounted on the carrier substrate by an adhesive layer that fills the first region between the frame and the first and second potting compounds for fixing the common frame to the substrate during the applying the common frame, and such that the first and second potting compounds do not directly adjoin the common frame, wherein a first chamber and a second chamber of the plurality chambers each have a diaphragm opening in a preferred direction, and wherein side surfaces of the diaphragm openings are formed at different angles and obliquely to a major surface of the substrate.

* * * * *